United States Patent
Weitzel et al.

[19]

[11] Patent Number: 6,100,549
[45] Date of Patent: Aug. 8, 2000

[54] HIGH BREAKDOWN VOLTAGE RESURF HFET

[75] Inventors: Charles E. Weitzel, Mesa; Mohit Bhatnagar, Chandler, both of Ariz.

[73] Assignee: Motorola, Inc., Schaumburg, Ill.

[21] Appl. No.: 09/133,041

[22] Filed: Aug. 12, 1998

[51] Int. Cl.$^7$ .................................................. H01L 31/109
[52] U.S. Cl. .......................... 257/194; 257/496; 257/623
[58] Field of Search ..................................... 257/183, 192, 257/194, 487, 491, 492, 496, 613, 615, 623, 629, 631

[56] References Cited

U.S. PATENT DOCUMENTS 5,043,776  8/1991  Hida ............................................ 357/22

FOREIGN PATENT DOCUMENTS 1-243474  9/1989  Japan ...................................... 257/192

*Primary Examiner*—Jereme Jackson, Jr.
*Assistant Examiner*—Bradley William Baumeister
*Attorney, Agent, or Firm*—Robert W. Hightower

[57] ABSTRACT

A high breakdown voltage HFET includes a reduced surface field (RESURF) layer of p-type conductivity GaN positioned on a substrate with a channel layer of n-type conductivity GaN positioned thereon. A barrier layer of n-type conductivity $Al_xGa_{1-x}N$ is positioned on the channel layer to form a lateral channel adjacent to and parallel with the interface. A gate electrode is positioned on the barrier layer overlying the lateral channel and a drain electrode is positioned on the channel layer in contact with the lateral channel and spaced to one side of the gate electrode a distance which determines the breakdown voltage. A source electrode is positioned on the channel layer to the opposite side of the gate electrode, in contact with the lateral channel and also in contact with the RESURF layer.

18 Claims, 1 Drawing Sheet

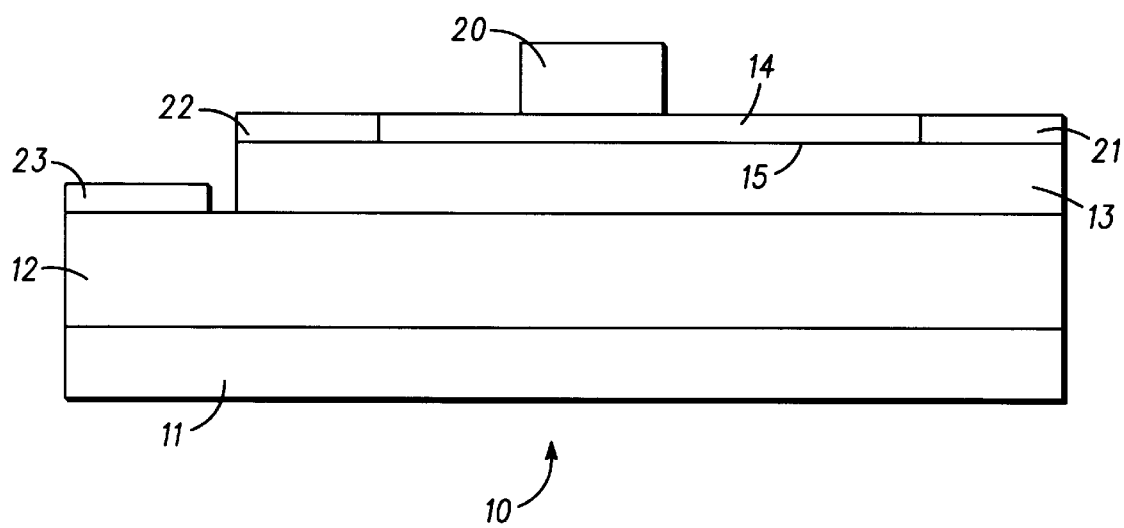

HIGH BREAKDOWN VOLTAGE RESURF HFET

FIELD OF THE INVENTION

The present invention pertains to heterojunction field effect transistors (HFET) and more specifically to an HFET with very low on-resistance and high breakdown voltage.

BACKGROUND OF THE INVENTION

In the past, the semiconductor industry has utilized silicon carbide to form a variety of transistors including vertical transistors, lateral transistors, metal semiconductor field effect transistors (MESFETs), and metal oxide semiconductor field effect transistors (MOSFETs). One problem with the prior lateral MOSFETs, is the breakdown voltage. Typically, prior lateral MOSFETs have breakdown voltages less than approximately 100 volts. Such low breakdown voltages prevent utilizing the prior lateral MOSFETs in high voltage applications such as power devices for motor controls and power supplies. These type of applications typically require breakdown voltages of at least 150 volts and, preferably as much as 500 volts to 1200 volts. Lateral silicon carbide devices have achieved the 150 volts breakdown voltage and, in addition, silicon carbide devices have about ten times lower on-resistance than comparable silicon devices.

A new and promising technology for very high power is the fabrication of gallium nitride (GaN) devices. However, in spite of unique advantages of GaN based devices, the applicability of GaN vertical devices in power device applications presently seems very difficult to realize. This is due to the lack of GaN substrates that could be used for growing homoepitaxial layers. Further, while GaN appears promising for very high voltage applications no one has been able to fabricate a GaN device with a sufficiently high breakdown voltage.

Accordingly, it would be highly desirable to provide very high voltage GaN devices with a high breakdown voltage and low on-resistance.

It is a purpose of the present invention to provide a new and improved high breakdown voltage heterostructure field effect transistor.

It is another purpose of the present invention to provide a new and improved high breakdown voltage heterostructure field effect transistor with a very low on-resistance.

It is still another purpose of the present invention to provide a new and improved high breakdown voltage heterostructure field effect transistor for use in very high power applications.

SUMMARY OF THE INVENTION

The above problems and others are at least partially solved and the above purposes and others are realized in a high breakdown voltage HFET including a reduced surface field layer positioned on a substrate, a channel layer positioned on the reduced surface field layer, and a barrier layer positioned on the channel layer to form an interface therebetween. The reduced surface field layer has a first conductivity and the channel layer has a second conductivity. The barrier layer and the channel layer cooperate to form a lateral channel adjacent to and parallel with the interface. A gate electrode is positioned on the barrier layer overlying the lateral channel and a drain electrode is positioned on the channel layer in contact with the lateral channel and spaced to one side of the gate electrode a distance which substantially determines the breakdown voltage of the FET. A source electrode is positioned on the channel layer and spaced to an opposite side of the gate electrode. The source electrode is in contact with the lateral channel and also in contact with the reduced surface field layer.

The channel layer has a first depletion region adjacent an upper surface and a second depletion region adjacent a lower surface and the thickness and doping are designed such that the first and second depletion regions are merged, which allows a significant increase in the breakdown voltage of the FET. Also, the HFET can be fabricated from one of a silicon-germanium, gallium arsenide, indium phosphide and gallium-nitride material system.

In a preferred embodiment the high breakdown voltage HFET includes a reduced surface field layer of GaN having p-type conductivity positioned on the substrate, a channel layer of GaN having n-type conductivity positioned on the reduced surface field layer, and a barrier layer of $Al_xGa_{1-x}N$ positioned on the channel layer to form an interface therebetween. The barrier layer cooperates with the channel layer to form a lateral channel adjacent to and parallel with the interface. A gate electrode is positioned on the barrier layer overlying the lateral channel and a drain electrode is positioned on the channel layer in contact with the lateral channel and spaced to one side of the gate electrode a distance which substantially determines the breakdown voltage of the FET. A source electrode is positioned on the channel layer and spaced to an opposite side of the gate electrode with the source electrode being in contact with the lateral channel and in contact with the reduced surface field layer.

BRIEF DESCRIPTION OF THE DRAWING

Referring to the drawing, the single FIGURE is a simplified sectional view of a heterostructure field effect transistor in accordance with the present invention.

DESCRIPTION OF THE PREFERRED EMBODIMENT

Turning to the single FIGURE, a simplified sectional view is illustrated of a heterostructure field effect transistor (HFET) 10 in accordance with the present invention. HFET 10 includes a substrate 11 which may be, for example, a semi-insulating material or other material appropriate for the growth of additional layers of semiconducting material. While the preferred embodiment, which will be explained for a complete understanding of this invention is in the gallium nitride (GaN) material system, it should be understood that HFET incorporating the principles of this invention could be fabricated in silicon-germanium, gallium-arsenide, indium phosphide, or gallium-nitride material systems. Further, in the exemplary GaN material system described herein, and possibly in all or some of the other material systems, substrate 11 can be formed of sapphire, silicon, gallium-nitride, or silicon-carbide.

Substrate 11 may be a single layer of material or, in some applications and embodiments, may include additional layers (e.g. buffer layers and the like) which make it possible and/or practical to grow the additional layers to be explained. A reduced surface field (RESURF) layer 12 is positioned on the surface of substrate 11 by any convenient means, such as epitaxial growth or the like. In this embodiment RESURF layer 12 is composed of GaN and is doped for p-type conduction. A channel layer 13, which in this embodiment is GaN doped for n-type conduction, is positioned on the surface of RESURF layer 12. A barrier layer 14, which in this specific embodiment is composed of $Al_xGa_{1-x}N$, is positioned on channel layer 13 and forms an interface 15 therewith. A lateral channel region for HFET 10 is formed at interface 15 by the cooperation of the $Al_xGa_{1-x}N$ barrier layer 14 with the GaN channel layer 13.

Generally, in a simplified explanation of the RESURF principle, channel layer 13 has a first depletion region and RESURF layer 12 has a second depletion region. The first depletion region forms at interface 15 between channel layer 13 and barrier layer 14. The second depletion region is formed between channel layer 13 and RESURF layer 12. Channel layer 13 and RESURF layer 12 each being formed with a thickness and doping such that the first and second depletion regions are merged. This merging of the depletion regions leads to a reduction in the surface electric field of HFET 10 at interface 15 which substantially improves the given breakdown voltage without increasing the on-resistance.

In this preferred embodiment, RESURF layer 12 has a P-type doping concentration of approximately $1.4 \times 10^{16}$ to $6 \times 10^{16}$ atoms/cm$^3$ and a thickness of at least approximately five microns while the lateral channel has a sheet charge density of approximately $0.7 \times 10^{13}$ to $3 \times 10^{13}$. While some minimum amount of experimentation may be required for different material systems, it will be understood that the doping concentration and thickness of layers 12 and 13 are selected to provide a reduced surface field effect (RESURF) that lowers the on-resistance for a desired breakdown voltage of HFET 10.

A gate electrode 20 is positioned on the surface of barrier layer 14 overlying the lateral channel at interface 15. Gate electrode 20, in this embodiment forms a Schottky contact, and controls the lateral channel in a manner well known to those skilled in the art. A drain electrode 21 is positioned on channel layer 13 and in ohmic contact with lateral channel layer 13. Drain electrode 21 is spaced to one side of gate electrode 20 a distance which along with the RESURF condition primarily determines the breakdown voltage of HFET 10. A source electrode 22 is positioned on channel layer 13 and in ohmic contact with lateral channel layer 13. Source electrode 22 is spaced to an opposite side of gate electrode 21. Source electrode 22 is also in contact with RESURF layer 12 so as to provide the RESURF effect. The contact between source electrode 22 and RESURF layer 12 can be provided by an implant (not shown) or by etching down to RESURF layer 13 and forming an ohmic contact 23 thereon.

Thus, an HFET is disclosed which can be formed of, for example, GaN with an on-resistance at least four times lower than the on-resistance of SiC. Further, a RESURF layer is provided in the HFET so that the gate and drain can be separated to provide a very high operating and breakdown voltage while still taking advantage of the extremely low on-resistance. Other material systems can be utilized in the formation of an HFET and still realize many of these advantages.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A high breakdown voltage HFET comprising:
   a substrate;
   a reduced surface field layer positioned on the substrate, the reduced surface field layer having a first conductivity;
   a channel layer positioned on the reduced surface field layer, the channel layer having a second conductivity;
   a barrier layer positioned on the channel layer to form an interface therebetween, the barrier layer cooperating with the channel layer to form a lateral channel adjacent to and parallel with the interface;
   a gate electrode positioned on the barrier layer overlying the lateral channel;
   a drain electrode positioned on the channel layer in contact with the lateral channel and spaced to one side of the gate electrode a distance determining the breakdown voltage; and
   a source electrode positioned on the channel layer in contact with the lateral channel and spaced to an opposite side of the gate electrode, the source electrode also being in contact with the reduced surface field layer.

2. A high breakdown voltage HFET as claimed in claim 1 wherein the substrate is a semi-insulating material.

3. A high breakdown voltage HFET as claimed in claim 1 wherein the substrate is a selected from the group consisting of Si, GaN, GaAs, sapphire, and SiC.

4. A high breakdown voltage HFET as claimed in claim 1 wherein the reduced surface field layer includes GaN.

5. A high breakdown voltage HFET as claimed in claim 1 wherein the channel layer includes GaN.

6. A high breakdown voltage HFET as claimed in claim 1 wherein the barrier layer includes $Al_xGa_{1-x}N$.

7. A high breakdown voltage HFET as claimed in claim 1 wherein the reduced surface field layer is doped for p-type conduction.

8. A high breakdown voltage HFET as claimed in claim 1 wherein the channel layer is doped for n-type conduction.

9. A high breakdown voltage HFET as claimed in claim 1 wherein the channel layer has a first depletion region and the reduced surface field layer has a second depletion region with the reduced surface field layer and the channel layer each being formed with a thickness and doping such that the first and second depletion regions are merged.

10. A high breakdown voltage HFET as claimed in claim 1 wherein the HFET is one of a silicon-germanium, gallium arsenide, indium phosphide and gallium-nitride device.

11. A high breakdown voltage HFET comprising:
    a substrate;
    a reduced surface field layer of GaN positioned on the substrate, the reduced surface field layer having a first conductivity;
    a channel layer of GaN positioned on the reduced surface field layer, the channel layer having a second conductivity;
    a barrier layer of $Al_xGa_{1-x}N$ positioned on the channel layer to form an interface therebetween, the barrier layer cooperating with the channel layer to form a lateral channel adjacent to and parallel with the interface;
    a gate electrode positioned on the barrier layer overlying the lateral channel;
    a drain electrode positioned on the channel layer in contact with the lateral channel and spaced to one side of the gate electrode a distance determining the breakdown voltage; and
    a source electrode positioned on the channel layer in contact with the lateral channel and spaced to an opposite side of the gate electrode, the source electrode also being in contact with the reduced surface field layer.

12. A high breakdown voltage HFET as claimed in claim 11 wherein the substrate is a semi-insulating material.

13. A high breakdown voltage HFET as claimed in claim 11 wherein the substrate is a selected from the group consisting of Si, GaN, GaAs, sapphire, and SiC.

14. A high breakdown voltage HFET as claimed in claim 11 wherein the reduced surface field layer is doped for p-type conduction.

15. A high breakdown voltage HFET as claimed in claim 11 wherein the channel layer is doped for n-type conduction.

16. A high breakdown voltage HFET as claimed in claim 11 wherein the channel layer has a first depletion region and the reduced surface field layer has a second depletion region with the reduced surface field layer and the channel layer each being formed with a thickness and doping such that the first and second depletion regions are merged.

17. A high breakdown voltage HFET comprising:
  a substrate;
  a reduced surface field layer of GaN positioned on the substrate, the reduced surface field layer having p-type conductivity;
  a channel layer of GaN positioned on the reduced surface field layer, the channel layer having n-type conductivity;
  a barrier layer of $Al_xGa_{1-x}N$ positioned on the channel layer to form an interface therebetween, the barrier layer cooperating with the channel layer to form a lateral channel adjacent to and parallel with the interface;
  a gate electrode positioned on the barrier layer overlying the lateral channel;
  a drain electrode positioned on the channel layer in contact with the lateral channel and spaced to one side of the gate electrode a distance determining the breakdown voltage; and
  a source electrode positioned on the channel layer in contact with the lateral channel and spaced to an opposite side of the gate electrode, the source electrode also being in contact with the reduced surface field layer.

18. A high breakdown voltage HFET as claimed in claim 17 wherein the channel layer has a first depletion region and the reduced surface field layer has a second depletion region with the reduced surface field layer and the channel layer each being formed with a thickness and doping such that the first and second depletion regions are merged.

* * * * *